US012501932B2

(12) United States Patent
Loveday

(10) Patent No.: US 12,501,932 B2
(45) Date of Patent: Dec. 23, 2025

(54) AEROSOL GENERATION APPARATUS HAVING A CHASSIS COMPRISING A FLEXIBLE PART, AND CORRESPONDING ASSEMBLING METHOD

(71) Applicant: JT International SA, Geneva (CH)

(72) Inventor: Peter Loveday, Epsom (GB)

(73) Assignee: JT International SA (CH)

( * ) Notice: Subject to any disclaimer, the term of this patent is extended or adjusted under 35 U.S.C. 154(b) by 448 days.

(21) Appl. No.: 18/019,300

(22) PCT Filed: Aug. 9, 2021

(86) PCT No.: PCT/EP2021/072131

§ 371 (c)(1),
(2) Date: Feb. 2, 2023

(87) PCT Pub. No.: WO2022/034005

PCT Pub. Date: Feb. 17, 2022

(65) Prior Publication Data

US 2023/0270162 A1 Aug. 31, 2023

(30) Foreign Application Priority Data

Aug. 10, 2020 (EP) .................................... 20190216

(51) Int. Cl.
*A24F 47/00* (2020.01)
*A24F 40/40* (2020.01)
(Continued)

(52) U.S. Cl.
CPC .............. *A24F 40/40* (2020.01); *A24F 40/70* (2020.01); *H05K 1/028* (2013.01)

(58) Field of Classification Search
None
See application file for complete search history.

(56) References Cited

U.S. PATENT DOCUMENTS

2014/0110259 A1* 4/2014 Takahashi ............ G01N 21/658 204/603
2016/0095357 A1* 4/2016 Burton .................. A24F 40/485 206/242

(Continued)

FOREIGN PATENT DOCUMENTS

AU 2018256433 A1 11/2019
WO 2016028544 A1 2/2016

(Continued)

OTHER PUBLICATIONS

International Search Report for Application No. PCT/EP2021/072131 mailed Nov. 17, 2021, pp. 1-3.

(Continued)

*Primary Examiner* — Eric Yaary
(74) *Attorney, Agent, or Firm* — Lerner David LLP

(57) ABSTRACT

The present technology is directed to an aerosol generating apparatus. The aerosol generating apparatus comprising an internal assembly comprising a chassis and an electronic printed circuit, and an outer casing extending along a longitudinal axis (X) and defining an opening for insertion of the internal assembly along the longitudinal axis in a cavity of the outer casing. The chassis comprises a main part and a flexible part. The flexible part is elastically moveable with respect to the main part between a rest configuration, in which the internal assembly has a first extension (E3) along a transverse axis (Z) that is larger than an extension (E1) of the opening along the transverse axis, and a flexed or retracted configuration, in which the internal assembly has a second extension along the transverse axis that is smaller than the extension of the opening, so as to allow said insertion.

20 Claims, 4 Drawing Sheets

(51) Int. Cl.
*A24F 40/70* (2020.01)
*H05K 1/02* (2006.01)

(56) References Cited

U.S. PATENT DOCUMENTS

| | | | | |
|---|---|---|---|---|
| 2018/0177238 | A1* | 6/2018 | Bessant .................... | G01C 9/18 |
| 2020/0000146 | A1 | 1/2020 | Anderson et al. | |
| 2020/0113242 | A1 | 4/2020 | Novak, III et al. | |
| 2022/0175047 | A1* | 6/2022 | Fung ........................ | A24F 40/70 |

FOREIGN PATENT DOCUMENTS

| | | | |
|---|---|---|---|
| WO | 2016172023 | A1 | 10/2016 |
| WO | 2017163044 | A1 | 9/2017 |
| WO | 2020081849 | A2 | 4/2020 |

OTHER PUBLICATIONS

European Office Action for Application No. 21762004.6 dated Feb. 18, 2025, pp. 1-6.

* cited by examiner

AEROSOL GENERATION APPARATUS HAVING A CHASSIS COMPRISING A FLEXIBLE PART, AND CORRESPONDING ASSEMBLING METHOD

CROSS-REFERENCE TO RELATED APPLICATIONS

The present application is a national phase entry under 35 U.S.C. § 371 of International Application No. PCT/EP2021/072131, filed Aug. 9, 2021, published in English, which claims priority to EP Application No. EP20190216.0, filed Aug. 10, 2020, published in English, the disclosures of which are incorporated herein by reference.

FIELD OF THE INVENTION

The present invention deals with an aerosol generating apparatus.

The invention also deals with a method of assembling such an aerosol generating apparatus.

BACKGROUND OF THE INVENTION

Different types of aerosol generation apparatuses are known in the art. Generally, such apparatuses comprise a storage portion for storing an aerosol forming precursor, for example comprising a liquid or a solid. A heating system is formed of one or more electrically activated resistive heating elements arranged to heat said precursor to generate the aerosol. The aerosol is released into a flow path extending between an inlet and outlet of the device. The outlet may be arranged as a mouthpiece, through which a user inhales for delivery of the aerosol.

In some aerosol generation apparatuses, the precursor is stored in a removable cartridge. Thus, when the precursor is consumed, the cartridge can be easily removed and replaced.

The aerosol generation apparatus comprises an outer casing, and internal components, such as a battery, a printed circuit board and at least a part of the heating system connected to the battery through the circuit board. The outer casing participates in the external design of the apparatus, may receive the consumable cartridge and is handled by the user while operating the aerosol generation apparatus. The outer casing protects the internal components from external influence and prevents the user from touching the internal components directly. The internal components are carefully positioned with respect to each other and, for some of them, in close proximity or in contact with the outer casing in order to allow smooth operation of the apparatus.

In some cases, the outer casing is in at least two pieces, which are then fixed on each other around the internal components.

However, in order to improve the external design of the apparatus, tubular outer casings in a single piece have been proposed, in metal or plastic. In this case, the internal components may be mounted on a chassis, to form an internal assembly, which is then inserted in the outer casing via an opening.

In order to allow insertion of the internal assembly, the opening in the outer casing is rather large and to facilitate the insertion, the internal section of the outer casing along the length is invariable. However, for the aesthetics of the apparatus or for design reasons, it would be desirable to reduce the size of the opening without compromising the delicate positioning of the internal components within the outer casing or restraining the interior volume of the outer casing.

SUMMARY OF THE INVENTION

An aim of the invention is thus to provide an aerosol generation apparatus comprising an outer casing with a smaller opening.

To this end, the invention relates to an aerosol generating apparatus comprising:

- an internal assembly comprising a chassis, and an electronic printed circuit mounted on the chassis, and
- an outer casing extending along a longitudinal axis and defining an opening for insertion of the internal assembly along the longitudinal axis in a cavity formed by the outer casing,
- wherein the chassis comprises a main part, and a flexible part mounted on the main part and elastically moveable with respect to the main part between a rest configuration, in which the internal assembly has a first extension along a transverse axis perpendicular to the longitudinal axis that is larger than an extension of the opening along the transverse axis, and a flexed or retracted configuration, in which the internal assembly has a second extension along the transverse axis that is smaller than the extension of the opening, so as to allow said insertion.

Thanks to the above features, even if the internal assembly has a large cross section perpendicularly to the longitudinal axis that is larger than the cross section of the opening in a rest configuration, the internal assembly can be inserted through the opening in the flexed or retracted configuration.

According to some embodiments, the cavity has an extension along the transverse axis, said extension being larger than the extension of the opening, the cavity being configured for allowing the flexible part to elastically move with respect to the main part during said insertion from the flexed or retracted configuration to a work configuration, occupied when the internal assembly is in an inserted position, and in which the internal assembly has a third extension along the transverse axis that is larger than the extension of the opening.

Thanks to the above features, the flexible part may elastically expand with respect to the main part during said insertion from the flexed or retracted configuration to a work configuration. This allows giving the outer casing a shape which is larger in the middle than at its longitudinal extremities.

According to some embodiments, the opening is located at a first end of the outer casing along the longitudinal axis, the outer casing progressively or stepwise widening perpendicularly to the longitudinal axis from the first end towards a second end of the outer casing opposite the first end along the longitudinal axis.

Thanks to the above features, the outer casing may have various shapes, such as an ogival shape, from a side view.

According to some embodiments, the second end of the outer casing forms a bottom of the aerosol generating apparatus.

According to some embodiments, the outer casing is seamless.

Thanks to the above features, the outer casing has a very smooth shape and appearance. A seamless outer casing also ensures good mechanical resistance.

According to some embodiments, the flexible part comprises at least a base fixed on the main part of the chassis, and an arm extending from the base along the longitudinal axis.

Thanks to the above features, the flexible part is easy to fix on the main part of the chassis. It also provides the required flexibility and displacement of the flexible part in order to cooperate with the outer casing.

According to some embodiments, at least the arm is formed of an elastic electrically insulating material.

Thanks to the above features, the flexible part may serve as support for electric or electronic circuits or components.

According to some embodiments, in the work configuration, the arm is adapted to exert an elastic pressure on the outer casing, the outer casing having a radially inner surface with respect to the longitudinal axis, the arm preferably conforming to the radially inner surface in the work configuration.

Thanks to the above features, the flexible part of the chassis closely mates with the outer casing. This for example allows putting some of the internal components at a predefined small distance from the outer casing.

According to some embodiments, the arm has an extremity opposite the base along the longitudinal axis, the extremity defining an orifice, the aerosol generating apparatus comprising a cover adapted for closing an opening in the outer casing, said cover forming a hook adapted to cooperate with the orifice to retain the arm against the outer casing.

Thanks to the above features, the flexible part, or at least its extremity, may be fixed against the outer casing.

According to some embodiments, the flexible part further comprises an additional arm extending from the base along the longitudinal axis on the other side of the base with respect to the arm.

Thanks to the above features, the flexible part is longer than the arm.

According to some embodiments, said additional arm has an additional extremity opposite the base along the longitudinal axis, said additional extremity being fixed with respect to the main part of the chassis.

Thanks to the above features, the additional arm does not move with respect to the main part of the chassis, and has a predefined position with respect to the outer casing in the inserted position of the internal assembly.

According to some embodiments, the electronic printed circuit comprises at least a flexible portion mounted on the flexible part.

Thanks to the above features, the flexible portion of the electronic printed circuit is in a close vicinity with the outer casing.

According to some embodiments, the flexible part has a radially outer face with respect to the longitudinal axis, the radially outer face forming a recess housing said at least one flexible portion of electronic printed circuit, said at least one flexible portion of electronic printed circuit being sunken in the recess so as to prevent scratching of the electronic printed circuit by the outer casing during said insertion.

Thanks to the above features, the flexible portion of the electronic printed circuit is protected from being scratched by a border of the opening during insertion of the internal assembly in the outer casing.

The invention also relates to a method of assembling an aerosol generating apparatus comprising the following steps:

providing an internal assembly comprising a chassis, and an electronic printed circuit mounted on the chassis, the chassis comprising a main part, and a flexible part mounted on the main part, providing an outer casing extending along a longitudinal axis and defining an opening for insertion of the internal assembly along the longitudinal axis in a cavity defined by the outer casing, inserting the internal assembly in the cavity along the longitudinal axis through the opening, and during or before said the inserting step, elastically moving the flexible part with respect to the main part between a rest configuration, in which the internal assembly has a first extension along a transverse axis perpendicular to the longitudinal axis that is larger than an extension of the opening along the transverse axis, and a flexed or retracted configuration, in which the internal assembly has a second extension along the transverse axis that is smaller than the extension of the opening, so as to allow said insertion.

BRIEF DESCRIPTION OF THE DRAWINGS

The invention and its advantages will be better understood upon reading the following description, given solely by way of non-limiting example and made with reference to the appended drawings, in which.

DETAILED DESCRIPTION OF THE INVENTION

Figure 1:
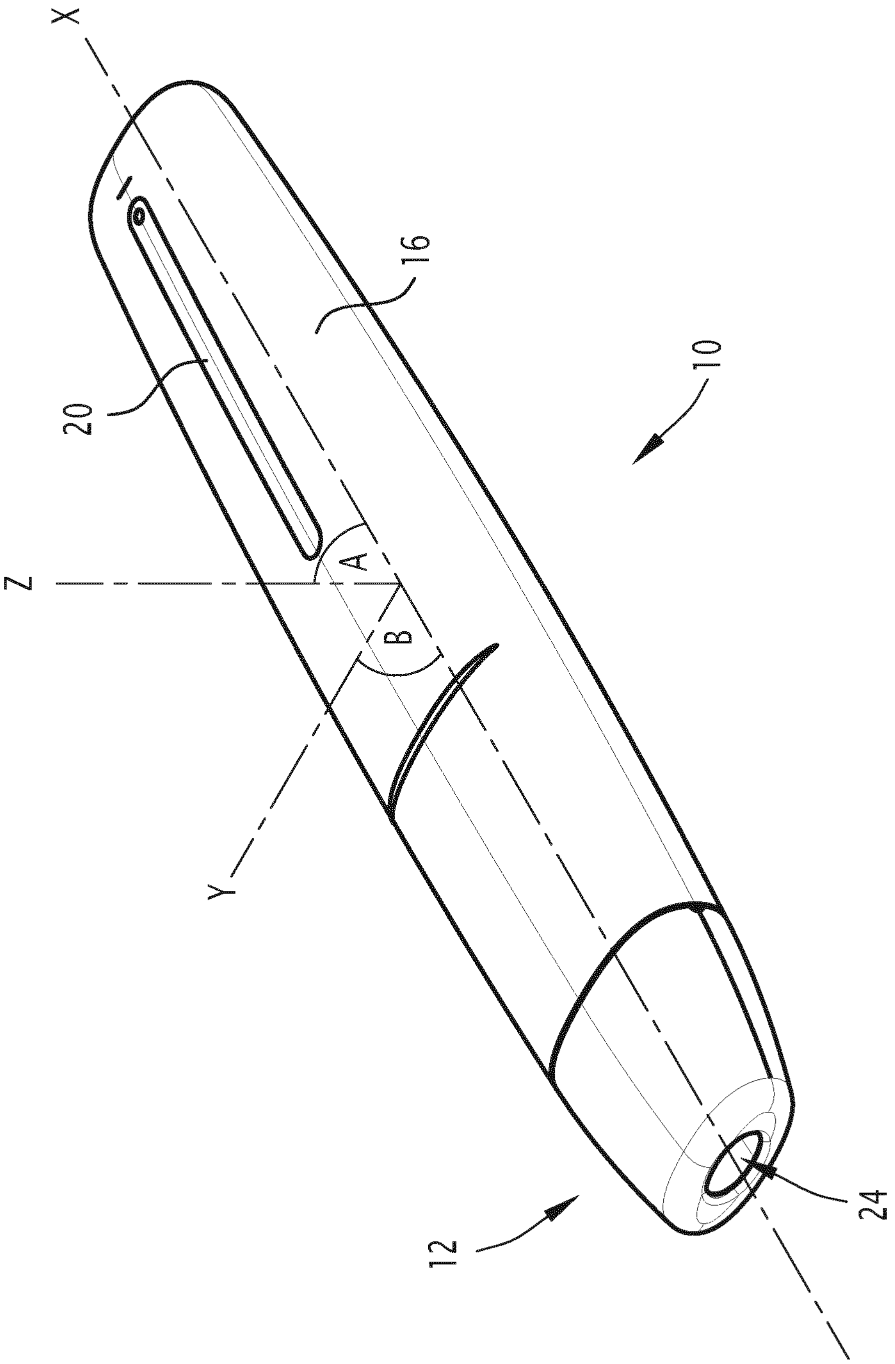
FIG. 1 is a perspective view of an aerosol generation apparatus according to the invention.

The invention is not limited to the details of construction set forth in the following description. It will be apparent to those skilled in the art having the benefit of the present disclosure that the invention is capable of other embodiments and of being practiced or being carried out in various ways.

As used herein, the term “aerosol generation apparatus” or “apparatus” may include a vaping device to deliver an aerosol to a user, including an aerosol for vaping, by means of aerosol generating unit (e.g. an aerosol generating element which generates vapor which condenses into an aerosol before delivery to an outlet of the device at, for example, a mouthpiece, for inhalation by a user). The device may be portable. “Portable” may refer to the device being for use when held by a user. The device may be adapted to generate amounts of aerosol, e.g. by activating a heater system for a variable amount of time (as opposed to a metered dose of aerosol) and/or for a predefined number of inhalations (i.e. puffs), which can be controlled by a trigger. The trigger may be user activated, such as a vaping button and/or inhalation sensor (e.g. pressure sensor or microphone). The inhalation sensor may be sensitive to the strength of inhalation as well as the duration of inhalation to enable a variable amount of vapor to be provided (so as to mimic the effect of smoking a conventional combustible smoking article such as a cigarette, cigar or pipe, etc.). The device may include a temperature regulation control to drive the temperature of the heater and/or the heated aerosol generating substance (aerosol pre-cursor) to a specified target temperature and thereafter to maintain the temperature at the target temperature that enables efficient generation of aerosol.

As used herein, the term "aerosol" may include a suspension of precursor as one or more of: solid particles; liquid droplets; gas. Said suspension may be in a gas including air. Aerosol herein may generally refer to/include a vapor. Aerosol may include one or more components of the precursor.

As used herein, the term "aerosol-forming precursor" or "precursor" or "aerosol-forming substance" or "substance" may refer to one or more of a: liquid; solid; gel; mousse; foam or other substances. The precursor may be processable by the heating system of the device to form an aerosol as defined herein. The precursor may comprise one or more of: nicotine; caffeine or other active components. The active component may be carried with an aerosol former, which may be a liquid. The aerosol former may include propylene glycol or glycerin. A flavoring may also be present. The flavoring may include Ethylvanillin (vanilla), menthol, Isoamyl acetate (banana oil) or similar. A solid aerosol forming substance may be in the form of a rod, which contains processed tobacco material, a crimped sheet or oriented strips of reconstituted tobacco (RTB).

An aerosol generation apparatus 10 according to the invention will now be described with reference to FIGS. 1 to 4.

Figure 4:
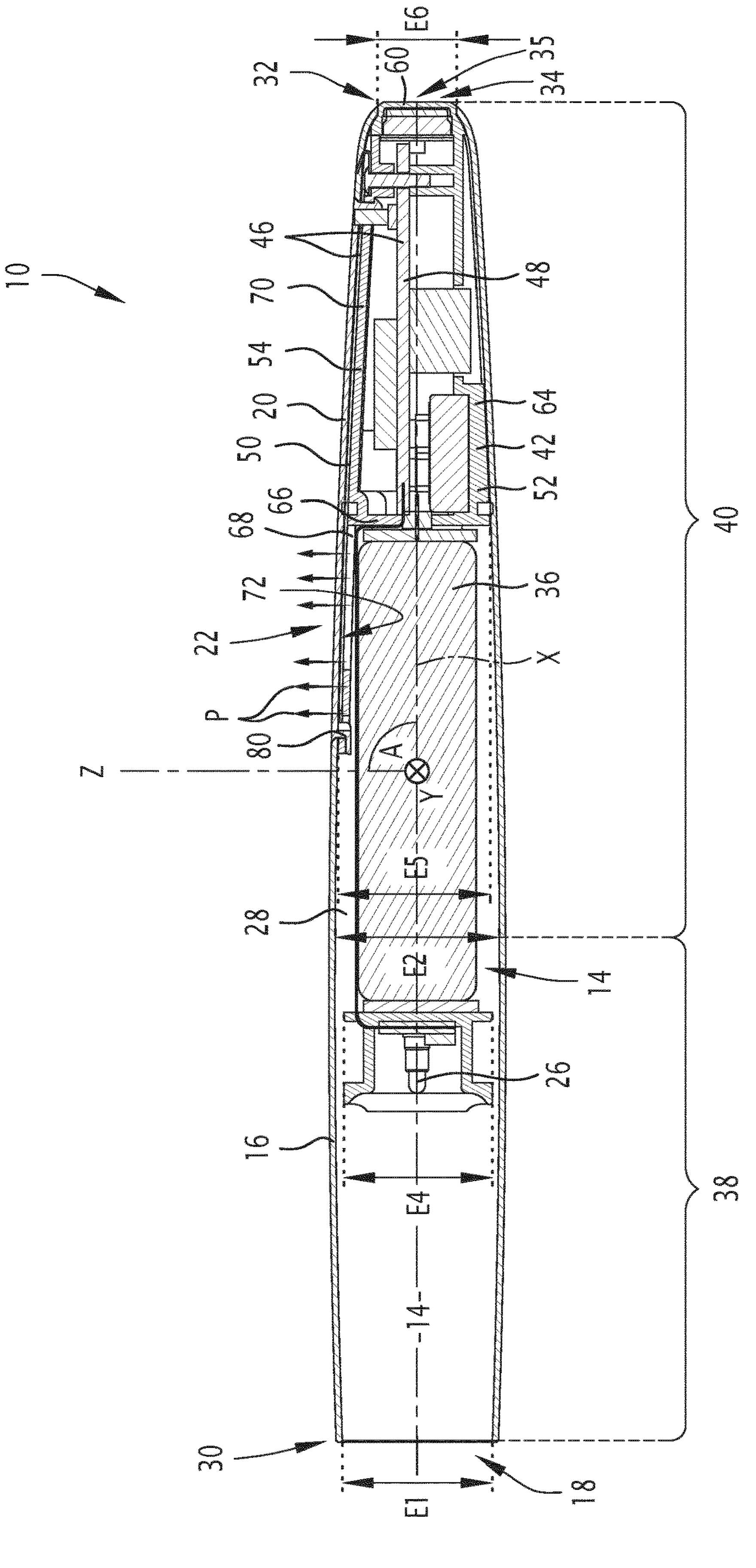
FIG. 4 is a cross-sectional view of a part of the aerosol generation apparatus shown in FIGS. 1 and 2 according to plan A shown in FIG. 1.

In this example, the aerosol generation apparatus 10 is designed to operate with a removable cartridge 12 (FIGS. 1 and 2) received in a payload compartment 14 shown in FIG. 4. The aerosol generation apparatus 10 extends along a longitudinal axis X. As shown in FIG. 1, the aerosol generation apparatus 10 is advantageously elongated along the longitudinal axis X. For example, the aerosol generation apparatus 10 is at least five times longer along the longitudinal axis X than along a first transverse axis Y perpendicular to the longitudinal axis X, and advantageously at least ten times longer along the longitudinal axis X than along a second transverse axis Z perpendicular to the longitudinal axis X and to the first transverse axis Y. Cross sections of the aerosol generation apparatus 10 perpendicularly to the longitudinal axis X for example have an oval or oblong shape.

Figure 2:
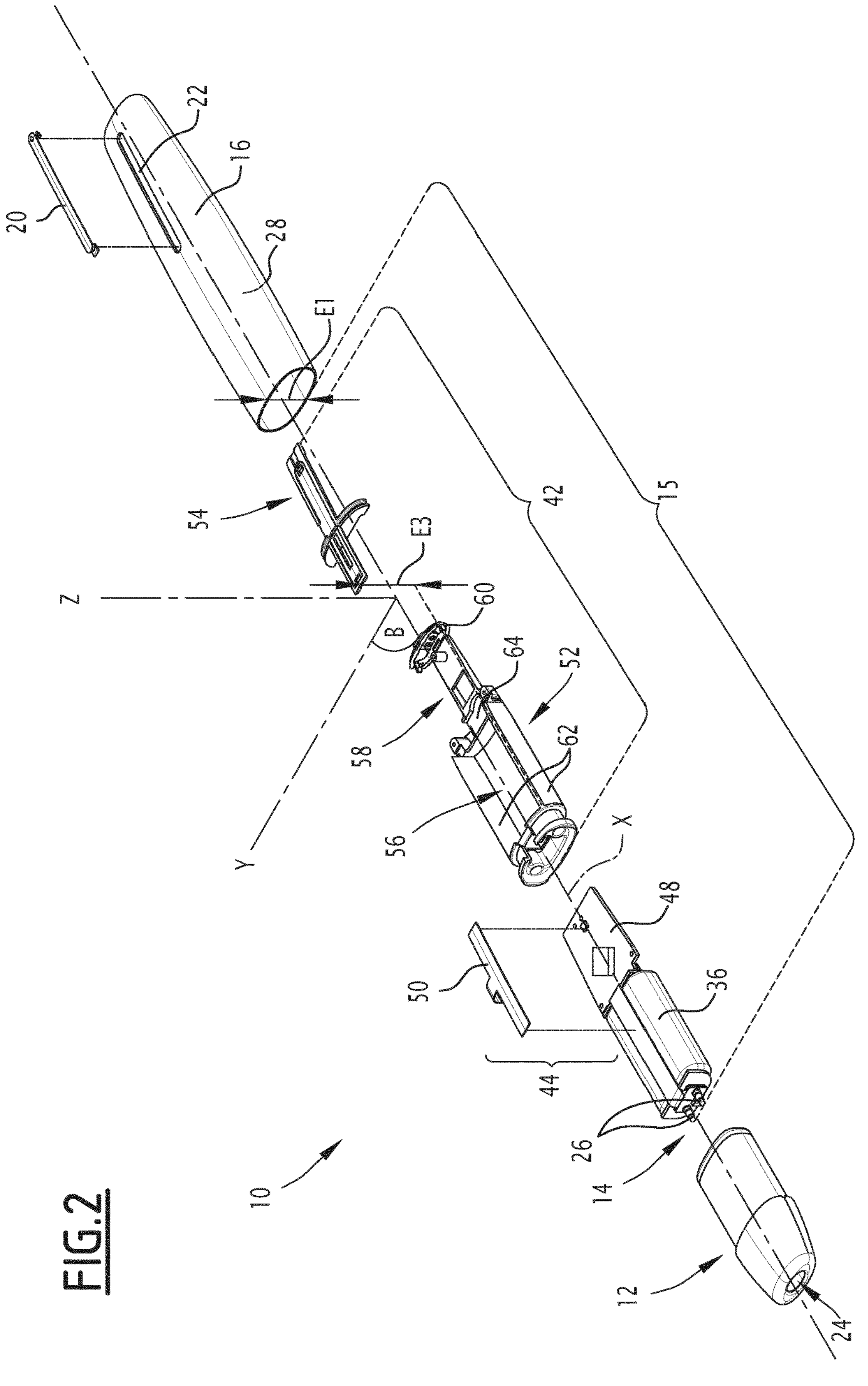
FIG. 2 is an exploded view of the aerosol generation apparatus shown in FIG. 1.
Figure 3:
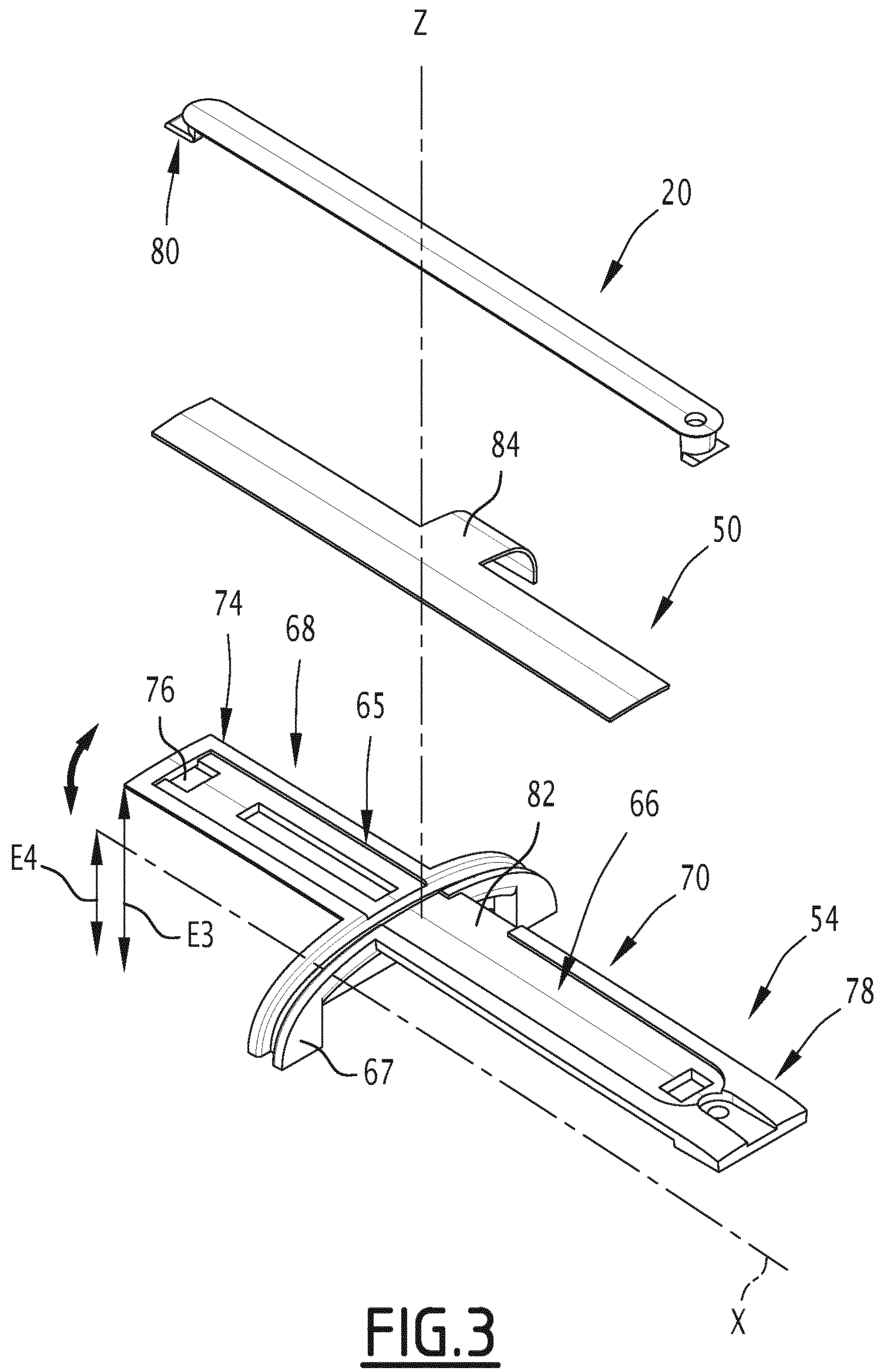
FIG. 3 is an exploded view of a part of the aerosol generation apparatus shown in FIGS. 1 and 2.

As best seen in FIG. 2, the apparatus 10 comprises an internal assembly 15, and an outside casing 16 defining an opening 18 for insertion of the internal assembly in the outer casing along the longitudinal axis X. The apparatus 10 advantageously comprises a cover 20 closing a second opening 22 defined by the outer casing 16.

The cartridge 12 comprises a precursor storage portion able to store a precursor and at least a heater (known in itself and not shown) able to heat the precursor to generate aerosol. The aerosol is evacuated through a vapor outlet 24 (FIG. 1). The heater of the cartridge 12 is connected to a power source of the device 10 through a pair of contacts arranged in both the cartridge 12 and the aerosol generation device 10. A pair of contacts 26 arranged in the payload compartment 14 is shown in FIGS. 2 and 4.

The outer casing 16 is elongated along the longitudinal axis X and defines an internal cavity 28 adapted to receive the internal assembly 15. At a first end 30 along the longitudinal axis X, the outer casing 16 defines the opening 18 which is for example perpendicular to the longitudinal axis X. At a second end 32 apposite the first end 30 along the longitudinal axis X, for example forming a bottom 34 of the apparatus 10, the outer casing 16 advantageously forms a charging opening 35 or pins (not shown) to charge a battery 36 of the apparatus 10.

The outer casing 16 is advantageously made of a single piece, for example molded or obtained by welding parts (e.g. anodized aluminium). The outer casing 16 is advantageously seamless. The outer casing 16 is for example symmetric with respect to plane A (defined by the longitudinal axis X and the second transverse axis Z) and advantageously with respect to a plan B defined by the longitudinal axis X and the first transverse axis Y. At any location along the longitudinal axis X, the outer casing 16 is for example larger along the first transverse axis Y than along the second transverse axis Z. The opening 18 has an extension E1 along the second transverse axis Z.

By "extension of an object along an axis", it is for example meant the smallest distance between too planes perpendicular to said axis and located on either sides of the object.

For example, the cavity 28 longitudinally comprises a first section 38 which transversely widens from the first end 30 towards the second end 32, and a second section 40 which transversely shortens towards the second end 32. The widening and shortening occur at least along one of the first transverse axis Y and the second transverse axis Z, for example along both transverse axes. Between the first section 38 and the second section 40, the cavity 28 has an extension E2 along the second transverse axis Z that is larger than the extension E1 of the opening 18.

Other than the battery 36, the internal assembly 15 notably comprises a chassis 42, and an electronic module 44 adapted to control the apparatus 10. The electronic module 44 comprises an electronic printed circuit 46 having a printed circuit board 48 and a flexible portion 50 electrically connected to the printed circuit board.

The chassis 42 comprises a main part 52, and a flexible part 54 mounted on the main part. The main part 52 defines, successively along the longitudinal axis X, a battery compartment 56 able to receive the battery 36, and a circuit compartment 58 able to receive the printed circuit board 48. The main part for examples includes a rear portion 60 transversely extending in the charging opening 35 in the inserted position of the internal assembly 15 shown in FIG. 4. For example, the main part 54 comprises two lateral members 62 abutting against the outer casing 16 along the first transverse axis Y, and another lateral member 64 abutting against the outer casing 16 along the second transverse axis Z in the inserted position.

The flexible part 54 is elastically moveable with respect to the main part 52 between a rest configuration (shown in FIG. 2 in an exploded manner), in which the internal assembly 15 has a first extension E3 along the transverse axis Z that is larger than the extension E1 of the opening 18, and a flexed or retracted configuration (not shown but symbolized on FIGS. 3 and 4), in which the internal assembly has a second extension E4 along the transverse axis Z that is smaller than the extension E1, so as to allow insertion of the internal assembly 15 in the cavity 28 via the opening 18 along the longitudinal axis X. The rest configuration is such that, if the flexible part 54 was maintained in position without ability to flex in the direction of the second transverse axis Z, the internal assembly 15 could not enter the cavity 28.

Advantageously, the flexible part 54 is elastically moveable with respect to the main part 52 from the flexed or retracted configuration, to a work configuration (shown in FIG. 4), occupied when the internal assembly 15 is in the inserted position, and in which the internal assembly has a third extension E5 along the transverse axis Z that is larger than the extension E1 of the opening 16. According to a particular embodiment, the work configuration is analogous to the rest configuration, i.e. the third extension E5 is approximately equal to the first extension E3. The flexible part 54 has a radially outer face 65 with respect to the longitudinal axis X, the radially outer face 65 forming a recess 66 housing the flexible portion 50 of the electronic printed circuit 46. The flexible part 54 for example comprises a base 67 extending along the first transverse axis Y and fixed on the main part 52 (at least in the inserted position), an arm 68 longitudinally extending from the base, and advantageously an additional arm 70 longitudinally extending from the base on the other side of the base with respect to said arm 68. In a particular embodiment, the third extension E5 is larger than an extension E6 of the charging opening 35 or the bottom 34 of the outer casing 16 at the second end 32.

In the rest configuration, the arm 68 is a cantilevered member. The arm 68 is adapted to flex along the second transverse axis Z with respect to the main part 52. In the inserted position, the arm 68 is advantageously directed toward the opening 18. According a particular embodiment, in the work configuration, the arm 68 is adapted to exert an elastic pressure P on the outer casing 16. In the work configuration, the arm 68 preferably conforms to a radially inner surface 72 of the outer casing 16 with respect to the longitudinal axis X. The arm 68 is advantageously formed of an elastic electrically insulating material, for example PEEK (polyether ether ketone). The arm 68 has an extremity 74 opposite the base 66 along the longitudinal axis X, the extremity for example defining an orifice 76. The extremity 74 is closer to the longitudinal axis X in the flexed or retracted configuration than in the rest configuration or in the work configuration.

The additional arm 70 has an additional extremity 78 opposite the base 67 along the longitudinal axis X, said additional extremity may be fixed with respect to the main part 52 of the chassis 42. The arm 68 and the additional arm 70 altogether longitudinally extend between the battery compartment 56 and the circuit compartment 58 in the inserted position, for example from at least ½ of the battery compartment's length to at least ¾ of the circuit compartment's length.

Seen along the longitudinal axis X, the base 67 for example has an arched shape adapted for mating with the radially inner surface 72 of the outer casing 16. The base 67 is for example located between the battery compartment 56 and the circuit compartment 58 along the longitudinal axis X.

The cover 20 for example forms a hook 80 adapted to cooperate with the orifice 76 to retain the arm 68 against the outer casing 16. Advantageously, the cover 20 is made of a material having a high dielectric constant.

The flexible portion 50 forms a capacitive panel used to control operation of the apparatus 10. Particularly, the flexible portion 50 is able to ensure a capacitive touch function of the apparatus 10. The flexible portion 50 is advantageously sunken in the recess 66 so as to prevent scratching of the electronic printed circuit 46 by the outer casing 16 during the insertion. The flexible portion 50 is for example adapted to detect touch movements of a user (not shown) on and/or along the cover 20. The flexible portion 50 is adhered to the base of the recess 66. In particular embodiments, the flexible portion may include antennas, capacitive sensors, LED, contacts or user interface components. The recess 66 for example extends longitudinally on both the arm 68 and the additional arm 70. The recess 66 advantageously forms a side opening 82 for a connecting member 84 of the flexible portion 50 extending along the first transverse axis Y.

A method of assembling the apparatus 10 will now be described.

At first, the internal assembly 15 is provided. In particular, the battery 36 and the printed circuit board 48 are mounted on the main part 52 of the chassis 42. The flexible part 54 of the chassis is mounted on the main part 52. The flexible portion 50 of the electronic printed circuit 46 is fixed, for example glued, to the flexible part 54 in the recess 66. At this stage, the internal assembly 15 is outside the outer casing 16, and the flexible part 54 is in the rest configuration.

Then the internal assembly 15 is inserted in the cavity 28 along the longitudinal axis X through the opening 18. During the insertion, the outer casing 16 presses on the arm 68 of the flexible part 54, and deflects from the rest configuration to the flexed or retracted configuration, for example when the extremity 74 reaches the opening 18. In other words, during the insertion, the flexible part 54 elastically moves with respect to the main part 52 in order to decrease the extension of the internal assembly 15 from the first extension E3 (larger than E1) to the second extension E4 (smaller than E1).

In a particular embodiment, the flexible part 54 is fixed in the flexed or retracted configuration, for example by a latch (not shown), before insertion, and the latch is released after insertion.

During the insertion, the base 67 advantageously goes through the opening 18 before the extremity 74 of the arm 68, so that the movement from the rest configuration to the flexed or retracted configuration is a consequence of the insertion movement. The flexible portion 50 being sunken in the recess 66, the flexible portion is protected from scratches from the outer casing 16.

Advantageously, when the internal assembly 15 is in the inserted position, the flexible part 54 elastically releases from the flexed or retracted configuration to the work configuration, with a third extension E5 again larger than the extension E1. This allows putting the flexible portion 50 of the electronic printed circuit 46 is close contact with the cover 20.

Thanks to the above features, the opening 18 of apparatus 10 is smaller, while allowing insertion of the internal assembly 15 in the cavity 28 and adequate positioning of the internal assembly, in particular of the flexible portion 50 of electronic printed circuit 46.

The invention claimed is:

1. An aerosol generating apparatus comprising:

an internal assembly comprising a chassis and an electronic printed circuit mounted on the chassis; and an outer casing extending along a longitudinal axis (X) and defining an opening for insertion of the internal assembly along the longitudinal axis (X) in a cavity formed by the outer casing, wherein:

the opening is located at a first end of the outer casing along the longitudinal axis (X), the outer casing progressively or stepwise widening perpendicularly to the longitudinal axis (X) from the first end towards a second end of the outer casing opposite the first end along the longitudinal axis (X), the chassis comprises a main part and a flexible part mounted on the main part, and the flexible part is elastically moveable with respect to the main part between a rest configuration, in which the internal assembly has a first extension (E3) along a transverse axis (Z) perpendicular to the longitudinal axis (X) that is larger than an extension (E1) of the opening along the transverse axis (Z), and a flexed or retracted configuration, in which the internal assembly has a second extension (E4) along the transverse axis (Z) that is smaller than the extension (E1) of the opening, so as to allow said insertion.

2. The aerosol generating apparatus according to claim 1, wherein the cavity has an extension (E4) along the transverse axis (Z), said extension (E4) being larger than the extension (E2) of the opening, the cavity being configured for allowing the flexible part to elastically move with respect to the main part during said insertion from the flexed or retracted configuration to a work configuration, occupied when the internal assembly is in an inserted position, and in which the internal assembly has a third extension (E5) along the transverse axis (Z) that is larger than the extension (E1) of the opening.

3. The aerosol generating apparatus according to claim 1, wherein the second end of the outer casing forms a bottom of the aerosol generating apparatus.

4. The aerosol generating apparatus according to claim 1, wherein the outer casing is seamless.

5. The aerosol generating apparatus according to claim 1, wherein the flexible part comprises at least a base fixed on the main part of the chassis and an arm extending from the base along the longitudinal axis (X).

6. The aerosol generating apparatus according to claim 5, wherein the arm is formed of an elastic electrically insulating material.

7. The aerosol generating apparatus according to claim 5, wherein, in the work configuration, the arm is adapted to exert an elastic pressure (P) on the outer casing, the outer casing having a radially inner surface with respect to the longitudinal axis (X).

8. The aerosol generating apparatus according to claim 5, wherein the arm has an extremity opposite the base along the longitudinal axis (X), the extremity defining an orifice, and wherein the aerosol generating apparatus comprises a cover adapted for closing an opening in the outer casing, said cover forming a hook adapted to cooperate with the orifice to retain the arm against the outer casing.

9. The aerosol generating apparatus according to claim 5, wherein the flexible part further comprises an additional arm extending from the base along the longitudinal axis (X) on the other side of the base with respect to the arm.

10. The aerosol generating apparatus according to claim 9, wherein said additional arm has an additional extremity opposite the base along the longitudinal axis (X), said additional extremity being fixed with respect to the main part of the chassis.

11. The aerosol generating apparatus according to claim 1, wherein the electronic printed circuit comprises at least a flexible portion mounted on the flexible part.

12. The aerosol generating apparatus according to claim 11, wherein the flexible part has a radially outer face with respect to the longitudinal axis (X), the radially outer face forming a recess housing said at least one flexible portion of electronic printed circuit, said at least one flexible portion of electronic printed circuit being sunken in the recess so as to prevent scratching of the electronic printed circuit by the outer casing during said insertion.

13. A method of assembling an aerosol generating apparatus, the method comprising:

providing an internal assembly comprising a chassis, and an electronic printed circuit mounted on the chassis, the chassis comprising a main part, and a flexible part mounted on the main part;

providing an outer casing extending along a longitudinal axis (X) and defining an opening for insertion of the internal assembly along the longitudinal axis (X) in a cavity defined by the outer casing, wherein the opening is located at a first end of the outer casing along the longitudinal axis (X), the outer casing progressively or stepwise widening perpendicularly to the longitudinal axis (X) from the first end towards a second end of the outer casing opposite the first end along the longitudinal axis (X);

inserting the internal assembly in the cavity along the longitudinal axis (X) through the opening; and during or before said the inserting step, elastically moving the flexible part with respect to the main part between a rest configuration, in which the internal assembly has a first extension (E3) along a transverse axis (Z) perpendicular to the longitudinal axis (X) that is larger than an extension (E1) of the opening along the transverse axis (Z), and a flexed or retracted configuration, in which the internal assembly has a second extension (E3) along the transverse axis (Z) that is smaller than the extension (E1) of the opening, so as to allow said insertion.

14. The aerosol generating apparatus according to claim 7, wherein the arm conforms to the radially inner surface in the work configuration.

15. An aerosol generating apparatus comprising:

an internal assembly comprising a chassis and an electronic printed circuit mounted on the chassis; and an outer casing extending along a longitudinal axis (X) and defining an opening for insertion of the internal assembly along the longitudinal axis (X) in a cavity formed by the outer casing, wherein:

the chassis comprises a main part and a flexible part mounted on the main part, the flexible part is elastically moveable with respect to the main part between a rest configuration, in which the internal assembly has a first extension (E3) along a transverse axis (Z) perpendicular to the longitudinal axis (X) that is larger than an extension (E1) of the opening along the transverse axis (Z), and a flexed or retracted configuration, in which the internal assembly has a second extension (E4) along the transverse axis (Z) that is smaller than the extension (E1) of the opening, so as to allow said insertion, the electronic printed circuit comprises at least a flexible portion mounted on the flexible part, and the flexible part has a radially outer face with respect to the longitudinal axis (X), the radially outer face forming a recess housing said at least one flexible portion of electronic printed circuit, said at least one flexible portion of electronic printed circuit being sunken in the recess so as to prevent scratching of the electronic printed circuit by the outer casing during said insertion.

16. The aerosol generating apparatus according to claim 15, wherein the cavity has an extension (E4) along the transverse axis (Z), said extension (E4) being larger than the extension (E2) of the opening, the cavity being configured for allowing the flexible part to elastically move with respect to the main part during said insertion from the flexed or retracted configuration to a work configuration, occupied when the internal assembly is in an inserted position, and in which the internal assembly has a third extension (E5) along the transverse axis (Z) that is larger than the extension (E1) of the opening.

17. The aerosol generating apparatus according to claim 15, wherein the outer casing is seamless.

18. The aerosol generating apparatus according to claim 15, wherein the flexible part comprises at least a base fixed on the main part of the chassis and an arm extending from the base along the longitudinal axis (X).

19. The aerosol generating apparatus according to claim 18, wherein the arm is formed of an elastic electrically insulating material.

20. The aerosol generating apparatus according to claim 18, wherein, in the work configuration, the arm is adapted to exert an elastic pressure (P) on the outer casing, the outer casing having a radially inner surface with respect to the longitudinal axis (X).

* * * * *